United States Patent
Visani et al.

(10) Patent No.: US 10,749,661 B1
(45) Date of Patent: Aug. 18, 2020

(54) ADC-BASED SERDES WITH SUB-SAMPLED ADC FOR EYE MONITORING

(71) Applicant: Marvell International Ltd., Hamilton (BM)

(72) Inventors: Davide Visani, San Jose, CA (US); Min Wu, San Jose, CA (US); Paulo Isagani M. Urriza, Sunnyvale, CA (US); Mehedi Hasan, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/929,191

(22) Filed: Dec. 19, 2019

Related U.S. Application Data

(60) Provisional application No. 62/782,192, filed on Dec. 19, 2018.

(51) Int. Cl.
*H04L 7/00* (2006.01)
*H04L 1/20* (2006.01)
*H04L 25/02* (2006.01)

(52) U.S. Cl.
CPC ............ *H04L 7/0054* (2013.01); *H04L 1/203* (2013.01); *H04L 25/025* (2013.01); *H04L 25/0222* (2013.01)

(58) Field of Classification Search
CPC ... H04L 7/0054; H04L 1/203; H04L 25/0222; H04L 25/025
See application file for complete search history.

(56) References Cited

U.S. PATENT DOCUMENTS

| 1,091,437 | A | * | 3/1914 | McDonald | .............. | B60C 27/06 |
| | | | | | | 152/235 |
| 9,800,438 | B1 | * | 10/2017 | Zhang | ..................... | G01R 31/50 |
| 2013/0230093 | A1 | * | 9/2013 | Aziz | ................. | H04L 25/03057 |
| | | | | | | 375/233 |
| 2014/0192935 | A1 | * | 7/2014 | Palusa | ..................... | H04L 7/033 |
| | | | | | | 375/340 |
| 2016/0065394 | A1 | * | 3/2016 | Sindalovsky | ..... | H04L 25/03012 |
| | | | | | | 375/371 |
| 2016/0352557 | A1 | * | 12/2016 | Liao | ................... | H04L 27/3809 |

* cited by examiner

*Primary Examiner* — Freshteh N Aghdam

(57) ABSTRACT

Digital serializer/deserializer circuitry includes a data path and a date eye monitoring path. The data path includes a first analog-to-digital converter (ADC) to sample incoming data at a first rate, first digital filter circuitry to filter output of the first ADC, and a data slicer coupled to output of the first digital filter circuitry to output data above a threshold. The monitoring path includes a second ADC to sample the incoming data at a second rate lower than the first rate and to take samples at varying points along the incoming data waveform, second digital filter circuitry to filter output of the second ADC, and another data slicer coupled to output of the second digital filter circuitry to output data above an adjustable threshold and to sweep through varying threshold values. Error rate circuitry compares outputs of the data slicers to determine a data eye error rate.

20 Claims, 4 Drawing Sheets

ADC-BASED SERDES WITH SUB-SAMPLED ADC FOR EYE MONITORING

CROSS REFERENCE TO RELATED APPLICATION

This disclosure claims the benefit of commonly-assigned U.S. Provisional Patent Application No. 62/782,192, filed Dec. 19, 2018, which is hereby incorporated by reference herein in its entirety.

FIELD OF USE

This disclosure relates to data eye monitoring in ADC-based SerDes circuitry. More particularly, this disclosure relates to ADC-based SerDes circuitry in which a sub-sampled ADC is used for data eye monitoring.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

A "data eye" is a plot formed when a digital signal from a receiver is repetitively sampled and the signal amplitude forms a vertical value, while the data rate—i.e., time—provides the horizontal value. For some types of signals, the pattern produced looks like a series of eyes. The eye pattern provides information on the state of the signal and the effects of channel noise and inter-symbol interference. A signal with good noise characteristics has a well-defined eye—empty space surrounded by a plurality of signal traces—while a noisy or otherwise low-quality signal has a poorly defined eye with signal traces impinging into what should be the empty space in the center.

In SerDes (serializer/deserializer) systems used for serial communication between and within integrated circuit devices, data eye monitoring (also known as "eye opening monitoring" or EOM) is used as a measure of signal quality or error rate. In a data path of an analog SerDes system, the analog data is sampled, and compared to a threshold to derive the data signals. The eye is monitored by replicating the sampling and thresholding (or "slicing") circuitry in a parallel signal path and using that parallel signal path to sample data, sweeping through different sample points and different thresholds, other than or in addition to the sample points and thresholds used in the data path, to determine the form of the eye. An EOM error rate can then be determined by comparing the output of the parallel monitoring path to the output of the data path.

In a digital SerDes system, based on an analog-to-digital converter (ADC), EOM can be performed similarly to analog systems. Moreover, known digital EOM systems are frequently "destructive" (i.e., the monitoring affects the data signal) because normally less than the full signal path is replicated. Replicating the full digital receiver path for EOM, while non-destructive, has significant impacts on device area, power consumption and performance, because an ADC-based digital SerDes includes digital signal processing circuitry, including filters.

SUMMARY

Digital serializer/deserializer circuitry according to implementations of the subject matter of this disclosure includes a data path and a date eye monitoring path. The data path includes a first analog-to-digital converter configured to sample an incoming data waveform at a first sample rate, first digital filter circuitry configured to filter output of the first analog-to-digital converter, and a first output data slicer coupled to output of the first digital filter circuitry and configured to output data above a threshold. The data eye monitoring path includes a second analog-to-digital converter configured to sample the incoming data waveform at a second sample rate lower than the first sample rate, the second analog-to-digital converter further being configured to take samples at varying sampling points along the incoming data waveform, second digital filter circuitry configured to filter output of the second analog-to-digital converter, and a second output data slicer coupled to an output of the second digital filter circuitry, the second output data slicer being configured to output data above an adjustable threshold and to sweep through varying threshold values for different samples. The circuitry also includes error rate circuitry configured to compare outputs of the first output data slicer and the second output data slicer to determine a data eye error rate.

In a first implementation of such digital serializer/deserializer circuitry, the first analog-to-digital converter may be configured to sample the incoming data waveform at a first point in time, the second analog-to-digital converter may be configured to sample the incoming data waveform at a second point in time, among the varying sampling points, that is different from the first point in time, the second digital filter circuitry may include a channel estimation filter configured to determine a change in channel response between the first point in time and the second point in time, and the second digital filter circuitry may include an additional filter having filter characteristics of the first filter circuitry and configured to filter the change in channel response.

In a first variant of that first implementation, the channel estimation filter may be an adaptive filter. In that first variant, the adaptive filter may be a least-mean squares filter.

A second variant of that first implementation may further include comparator circuitry configured to compare output of the channel estimation filter to output of the second analog-to-digital converter to determine signal noise, and circuitry configured to combine the signal noise with output of the additional filter for input to the second output data slicer.

In that second variant, the channel estimation filter may further be configured to input the signal noise as an error for adaptation. Also in that second variant, the circuitry configured to combine the signal noise with output of the additional filter may be configured to apply a weight to the signal noise.

A third variant of the first implementation may further include delay circuitry for combining the output of the first digital filter circuitry with the output of the second digital filter circuitry for input to the second output data slicer.

In a second implementation of digital serializer/deserializer circuitry according to the subject matter of this disclosure, the first analog-to-digital converter may be configured to sample the incoming data waveform at a first point in time, the second analog-to-digital converter may be configured to sample the incoming data waveform at a second point in time, among the varying sampling points, that is different from the first point in time, and the second digital filter circuitry may include a channel estimation filter configured to determine a change in channel response between the first point in time and the second point in time, convolution circuitry configured to convolve the change in channel response with an output of the first digital filter circuitry to derive filter coefficients, and an additional filter using the filter coefficients derived by the convolution circuitry.

In a first variant of that second implementation, the convolution circuitry may include a microcontroller unit. A second variant of that second implementation, may further include delay circuitry for combining the output of the first digital filter circuitry with the output of the second digital filter circuitry for input to the second output data slicer.

A method of data eye monitoring in digital serializer/deserializer circuitry according to implementations of the subject matter of this disclosure includes sampling an incoming data waveform at a first sample rate, filtering, using a first filter, the incoming data waveform that is sampled at the first sample rate, slicing the incoming data waveform, as sampled at the first sample rate, to output data above a first threshold, sampling the incoming data waveform, at a second sample rate lower than the first sample rate, at a sampling point along the incoming data waveform, filtering, using a second filter, the incoming data waveform that is sampled at the second sample rate, slicing the incoming data waveform, as sampled at the second sample rate, to output data above an adjustable threshold, and comparing outputs of the first slicing and the second slicing to determine a data eye error rate.

In a first implementation of such a method, the sampling an incoming data waveform at the first sample rate may occur at a first point in time, the sampling the incoming data waveform, at the second sample rate lower than the first sample rate, may be performed at at least one second point in time that is different from the first point in time, at a sampling point that varies along the incoming data waveform, and the filtering the incoming data waveform that is sampled at the second sample rate may include estimating to determine a change in channel response between the first point in time and the second point in time, and further filtering the change in channel response.

In a first variant of that first implementation, the further filtering the change in channel response may include filtering the change in channel response using a second filter having filter characteristics of the first filter.

A second variant of that first implementation may further include comparing the change in channel response to the incoming data waveform sampled at a second sample rate to determine signal noise, and combining the signal noise with the further filtered change in channel response prior to the slicing the incoming data waveform to output data above the adjustable threshold.

According to that second variant, the estimating to determine a change in channel response may include inputting the signal noise as an error for adaptation.

Also according to that second variant, the combining the signal noise with the further filtered change in channel response, prior to the slicing the incoming data waveform to output data above the adjustable threshold, may include applying a weight to the signal noise.

A third variant of the first implementation may further include delaying the incoming data waveform that is sampled at the first sample rate, as filtered using the first filter, and combining the delayed filtered incoming data waveform with the incoming data waveform that is sampled at the second sample rate, as filtered using the second filter, prior to the slicing the incoming data waveform to output data above the adjustable threshold.

In a second implementation of a method according to the subject matter of this disclosure, the sampling an incoming data waveform at the first sample rate may occur at a first point in time, the sampling the incoming data waveform, at the second sample rate lower than the first sample rate, may be performed at at least one second point in time that is different from the first point in time, at a sampling point that varies along the incoming data waveform, and the filtering the incoming data waveform that is sampled at the second sample rate may include estimating to determine a change in channel response between the first point in time and the second point in time, convolving the change in channel response with an output of the first digital filter circuitry to derive filter coefficients, and filtering the incoming data waveform that is sampled at the second sample rate, using the filter coefficients derived by the convolving.

A first variant of that second implementation may further include delaying the incoming data waveform that is sampled at the first sample rate, as filtered using the first filter, and combining the delayed filtered incoming data waveform with the incoming data waveform that is sampled at the second sample rate, as filtered using the second filter, prior to the slicing the incoming data waveform to output data above the adjustable threshold.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
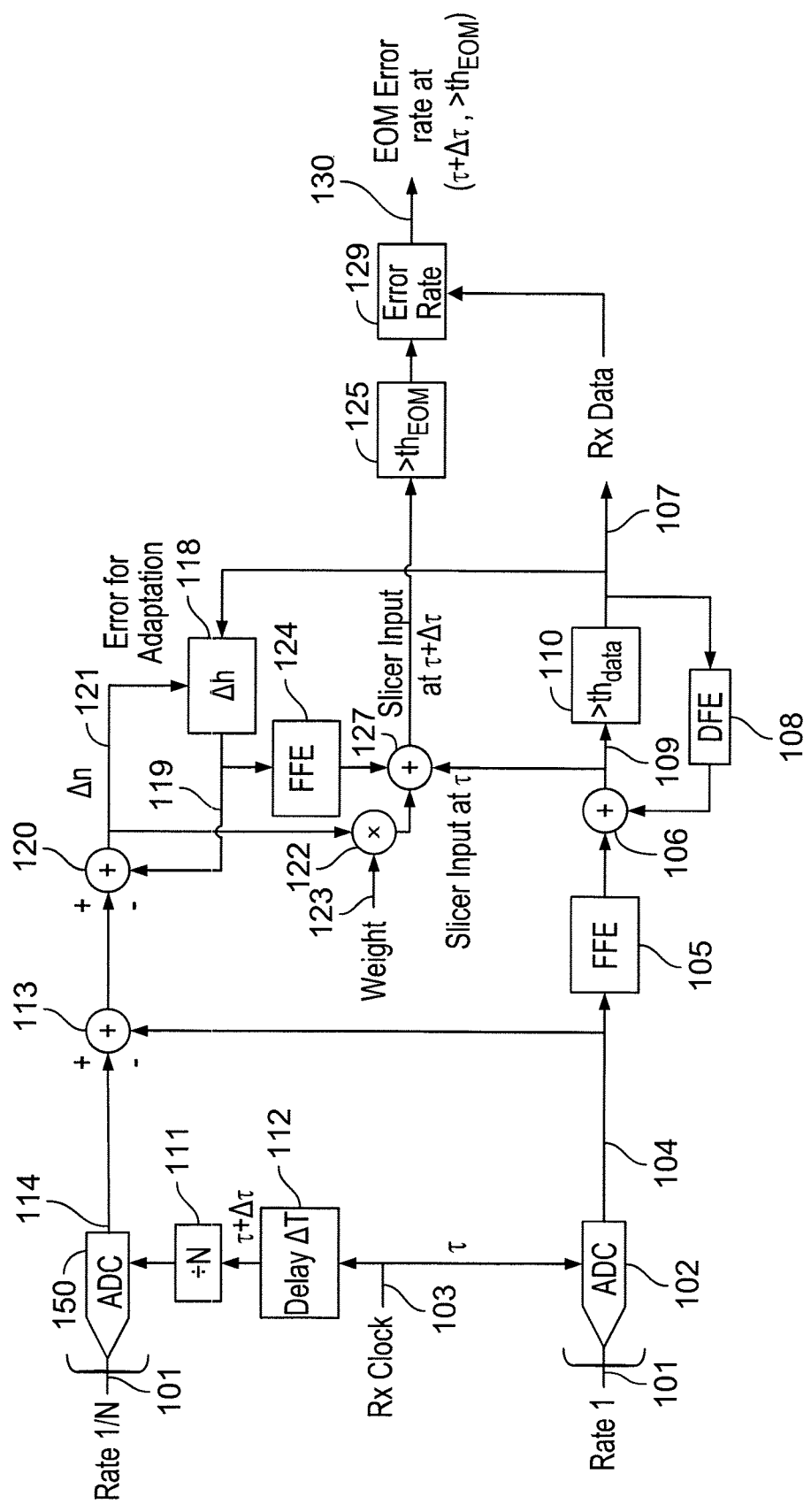
FIG. 1 is a diagram of a first implementation of an ADC-based SerDes device according to the subject matter of this disclosure.

As noted above, heretofore, to perform data eye monitoring in analog SerDes systems, a duplicate data path, replicating the main data path, has been provided. In digital SerDes systems, less than the full data path has been replicated for data eye monitoring, because of the penalties in device area, power consumption, and cost, that result from duplicating the full data path. However, duplicating less than the full data path results in monitoring that is "destructive," because the act of monitoring affects the signal being monitored, and therefore data eye monitoring cannot be performed in real time. It is desirable to be able to perform data eye monitoring "non-destructively" (i.e., without affecting the data signal).

The subject matter of this disclosure eliminates the foregoing penalties in digital implementations, including eliminating the destructive effect of data eye monitoring. The receiver side of digital SerDes systems may be based on an analog-to-digital converter (ADC). In accordance with implementations of the subject matter of this disclosure, a second path may be provided for data eye monitoring. The second path, like the main path, is based on an analog-to-digital converter, but is sub-sampled relative to the main path. That is, if the main path operates a data rate R, the EOM path operates at a data rate R/N, where N is an integer greater than '1'. The sub-sampled ADC-based EOM path determines channel response at a sampling position (i.e., time index) that differs from the data sampling position in the main path. As in the case of prior systems, the sampling position may differ from one cycle to the next, sweeping over the entire data eye. The difference between the output of the main path and the output of the EOM path can be used to determine the EOM error rate.

Because the EOM path in implementations of the subject matter of this disclosure operate at only a fraction (1/N) of the data rate of the main path, smaller, slower circuitry, which consumes less power may be provided. Nevertheless, sufficient filter circuitry is provided in the EOM path that the data in the main data path is not adversely affected by the monitoring function—i.e., the EOM path is non-destructive of the data in the main data path. Portions of the EOM path that are similar to portions of the main data path (e.g., the analog-to-digital converter), but operate at 1/N of the data rate of the main data path, consume about 1/N of the power of the corresponding portions of the main data path, but because the EOM path does not replicate the complete main data path, the overall power consumption of the EOM path is even less than 1/N of the power consumption of the main data path.

Implementations of the subject matter of this disclosure may be better understood by reference to the following mathematical discussion.

Output of an analog-to-digital converter that is sampling incoming data at a time T is a linear combination of sampled pulses weighted by data, plus a contribution by noise:

$$y_n^{(\tau)} = \sum_{k=-L}^{+L} h(kT + \tau)d_{n-k} + n(kT + \tau)$$

The input to the thresholding or slicing circuitry at time T is the ADC output as filtered by a feed-forward equalization (FFE) filter, combined with the output of a decision-feedback equalization (DFE) filter:

$$s_n^{(\tau)} = \sum_{m=-pre}^{+pst} w_m y_{n-m}^{(\tau)} - \sum_{i=1}^{L_{DFE}} f_i d_{n-i}$$

Similarly, the difference between the ADC output at an offset of $\Delta\tau$ from time $\tau$, and the ADC output at time $\tau$, is the difference in the linear combinations of pulses weighted by data, plus the difference in contributions by noise:

$$y_n^{(\tau+\Delta\tau)} - y_n^{(\tau)} = \sum_{k=-L}^{+L} (h(kT + \tau + \Delta\tau) - h(kT + \tau))d_{n-k} +$$

$$(n(kT + \tau + \Delta\tau) - n(kT + \tau))$$

$$= \sum_{k=-L}^{+L} \Delta h_k^{(\Delta\tau)} d_{n-k} + \Delta n_k^{(\Delta\tau)}$$

The input to the thresholding or slicing circuitry at $\tau+\Delta\tau$ can be estimated from the data path:

$$s_n^{(\tau+\Delta\tau)} = s_n^{(\tau)} + \sum_{m=-pre}^{+pst} w_m \sum_{k=-L}^{+L} \Delta h_k^{(\Delta\tau)} d_{n-m-k} + \sum_{m=-pre}^{+pst} w_m \Delta n_{n-m}^{(\Delta\tau)}$$

A first implementation 100 of the subject matter of this disclosure, shown in FIG. 1, determines the combination of the difference in the linear combinations of pulses weighted by data, plus the difference in contributions by noise.

The data path operates as follows. First, data signal 101 is sampled by ADC 102, which is clocked by receive clock signal 103. ADC 102 outputs samples $y_n^{(\tau)}$ at 104. The samples $y_n^{(\tau)}$ are filtered by feed-forward equalization (FFE) filter 105, and the filtered samples are combined at 106 with output data samples 107 which are fed back and filtered by decision-feedback equalization (DFE) filter 108. The combined filtered samples at 109 are input to thresholding or slicing circuitry 110 which generates the output data samples 107 based on a data threshold $th_{data}$. As noted above, the data path that has just been described operates in real time to provide output data 107.

The remainder of implementation 100 is provided for data eye monitoring. For the purpose of data eye monitoring, a second ADC 150 is provided. ADC 150 samples data signal 101 at a slower rate (i.e., sub-samples data signal 101), which is achieved by dividing receive clock 103 at 111 by an integer N. Because ADC 150 sub-samples data signal 101, the data eye monitoring circuitry can operate as slowly as 1/N times the speed of operation of the data path. Therefore, the data eye monitoring circuitry can be slower and consume less power and, per unit processing power, occupy less device area, than the data path circuitry.

In addition to, and before, being divided by N, receive clock 103 is delayed at 112 by $\Delta\tau$ relative to the sampling point of the data path. As noted above, $\Delta\tau$ can be varied to sweep the data eye. Thus, any given sample of sub-sampled ADC 150, in addition to occurring only once for every N samples taken by ADC 102, is offset in time from the nearest sample taken by ADC 102 by a time delay $\Delta\tau$, which could be negative (i.e., the sample taken by sub-sampled ADC 150 could be advanced ahead of, rather than delayed behind, the nearest sample taken by ADC 102).

In order to determine the difference in the linear combinations of pulses $y_n^{(\tau+\Delta\tau)} - y_n^{(\tau)}$, sample $y_n^{(\tau)}$ at 104 is subtracted at 113 from the time-offset sample $y_n^{(\tau+\Delta\tau)}$ output at 114 by sub-sampled ADC 150. Because sample 114 is delayed by $\Delta\tau$ relative to sample 104, all signals passing between the main data path and the data eye monitoring circuitry may be delayed appropriately (not shown) to align them correctly.

Output data samples 107 are input to $\Delta h$ channel response filter 118, the output 119 of which is subtracted at 120 from difference $y_n^{(\tau+\Delta\tau)} - y_n^{(\tau)}$ to yield noise $\Delta n$ at 121, which is weighted at 122 with weights 123 that may be derived from FFE filter 105. $\Delta h$ channel response filter 118 may be adaptive, such as a least-means-square filter. Noise $\Delta n$ at 121 is optionally input to $\Delta h$ channel response filter 118. Whether or not noise $\Delta n$ at 121 is input to $\Delta h$ channel response filter 118, the output of $\Delta h$ channel response filter 118 is filtered by a copy 124 of FFE filter 105 (except that FFE filter 124 can operate at the slower rate 1/N of sub-sampled ADC 150.

As noted above, the input of the input to the thresholding or slicing circuitry 125 in the data eye monitoring path at $\tau+\Delta\tau$ is the sum of the data-weighted channel response difference, the weighted noise, and the input of the input to the thresholding or slicing circuitry 110 in the data path at T. The input to the thresholding or slicing circuitry 110 in the data path at T is added at 127 to the data-weighted channel response difference output by FFE filter 124 and the weighted noise 122.

The output of thresholding or slicing circuitry 110 in the data path at T is input, along with the output of thresholding or slicing circuitry 125 in the data eye monitoring path, to error-rate circuitry 129 to provide the eye-monitoring error rate 130.

Figure 2:
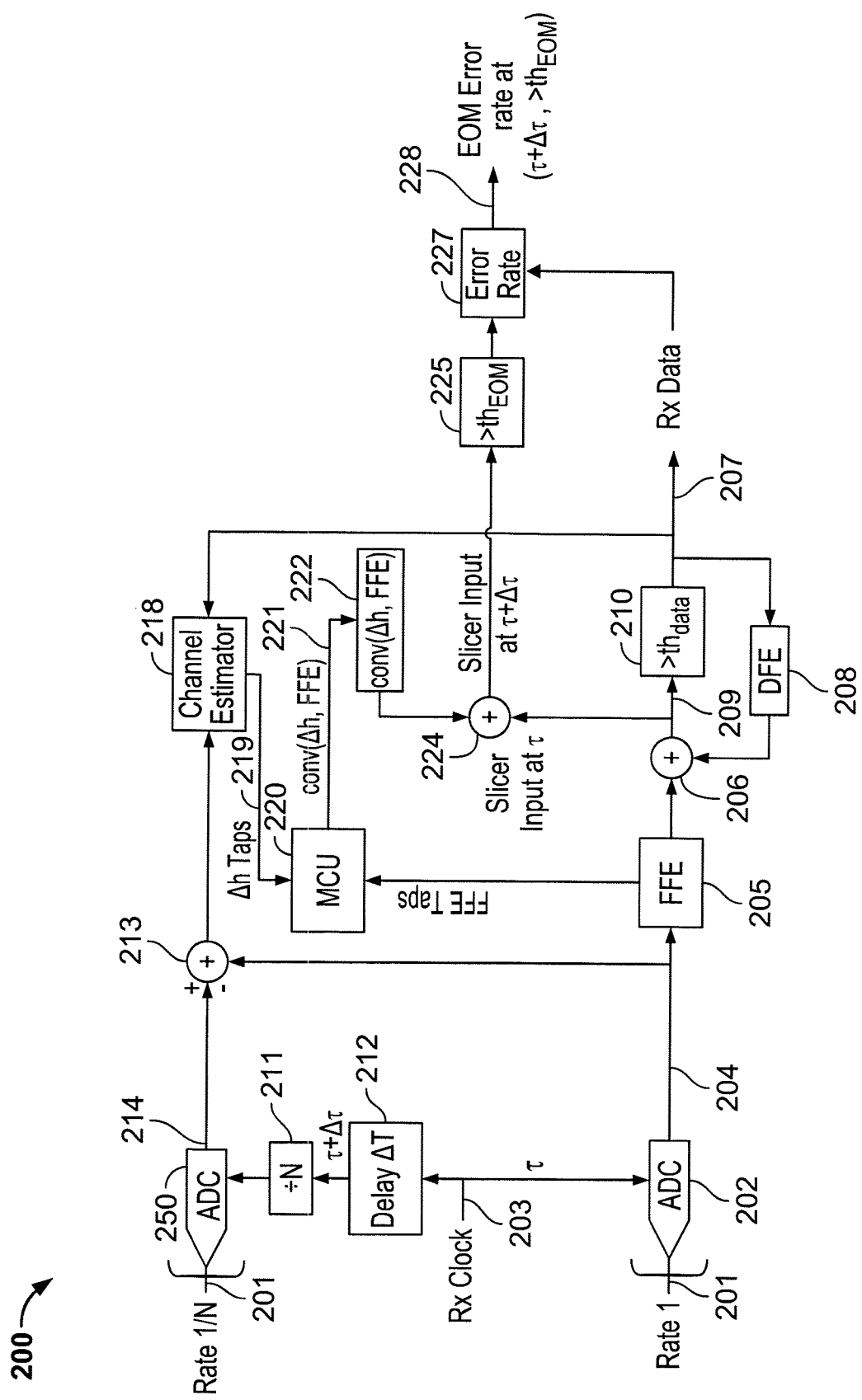
FIG. 2 is a diagram of a second implementation of an ADC-based SerDes device according to the subject matter of this disclosure.

A second implementation 200 of the subject matter of this disclosure, shown in FIG. 2, estimates Δh from a known phase relationship between ADC 202 and sub-sampled ADC 250. For example, Δh may be estimated using the technique described in commonly-assigned U.S. Pat. No. 10,291,437, which is hereby incorporated by reference in its entirety. The estimated Δh is then convolved with coefficients of the FFE filter from the main data path to determine coefficients of a filter that is used on the recovered data. The result is added to the slicer input of the main data path for input to the EOM slicer.

The data path of implementation 200 operates similarly to the data path of implementation 100, as follows. First, data signal 201 is sampled by ADC 202, which is clocked by receive clock signal 203. ADC 202 outputs samples $y_n^{(\tau)}$ at 204. The samples $y_n^{(\tau)}$ are filtered by feed-forward equalization (FFE) filter 205, and the filtered samples are combined at 206 with output data samples 207 which are fed back and filtered by decision-feedback equalization (DFE) filter 208. The combined filtered samples at 209 are input to thresholding or slicing circuitry 210 which generates the output data samples 207 based on a data threshold $th_{data}$. As noted above, the data path that has just been described operates in real time to provide output data 207.

The remainder of implementation 200 is provided for data eye monitoring. For the purpose of data eye monitoring, a second ADC 250 is provided. ADC 250 samples data signal 201 at a slower rate (i.e., sub-samples data signal 201), which is achieved by dividing receive clock 203 at 211 by an integer N. Because ADC 250 sub-samples data signal 201, the data eye monitoring circuitry can operate as slowly as 1/N times the speed of operation of the data path. Therefore, the data eye monitoring circuitry can be slower and consume less power and, per unit processing power, occupy less device area, than the data path circuitry.

In addition to, and before, being divided by N, receive clock 203 is delayed at 212 by Δτ relative to the sampling point of the data path. As noted above, Δτ can be varied to sweep the data eye. Thus, any given sample of sub-sampled ADC 250, in addition to occurring only once for every N samples taken by ADC 202, is offset in time from the nearest sample taken by ADC 202 by a time delay Δτ, which could be negative (i.e., the sample taken by sub-sampled ADC 250 could be advanced ahead of, rather than delayed behind, the nearest sample taken by ADC 202).

In order to determine the difference in the linear combinations of pulses $y_n^{(\tau+\Delta\tau)} - y_n^{(\tau)}$, sample $y_n^{(\tau)}$ at 204 is subtracted at 213 from the time-offset sample $y_n^{(\tau+\Delta\tau)}$ output at 214 by sub-sampled ADC 250. Because sample 214 is delayed by Δτ relative to sample 204, all signals passing between the main data path and the data eye monitoring circuitry may be delayed appropriately (not shown) to align them correctly.

Output data samples 207 are input to Δh channel estimator 218 along with difference 213. Channel estimate 219 is convolved at 220 with the taps of FFE filter 205. For example, the convolution may be performed by a microcontroller unit 220. The convolution output 221 may be used as the coefficients of a further filter 222 to which the output data samples 207 are input. The outputs of filter 222, and inputs 209 to thresholding or slicing circuitry 210, are combined at 224 for input to thresholding or slicing circuitry 225 in the data eye monitoring path.

The output of thresholding or slicing circuitry 210 in the data path at τ is input, along with the output of thresholding or slicing circuitry 225 in the data eye monitoring path, to error-rate circuitry 227 to provide the eye-monitoring error rate 228.

Figure 3:
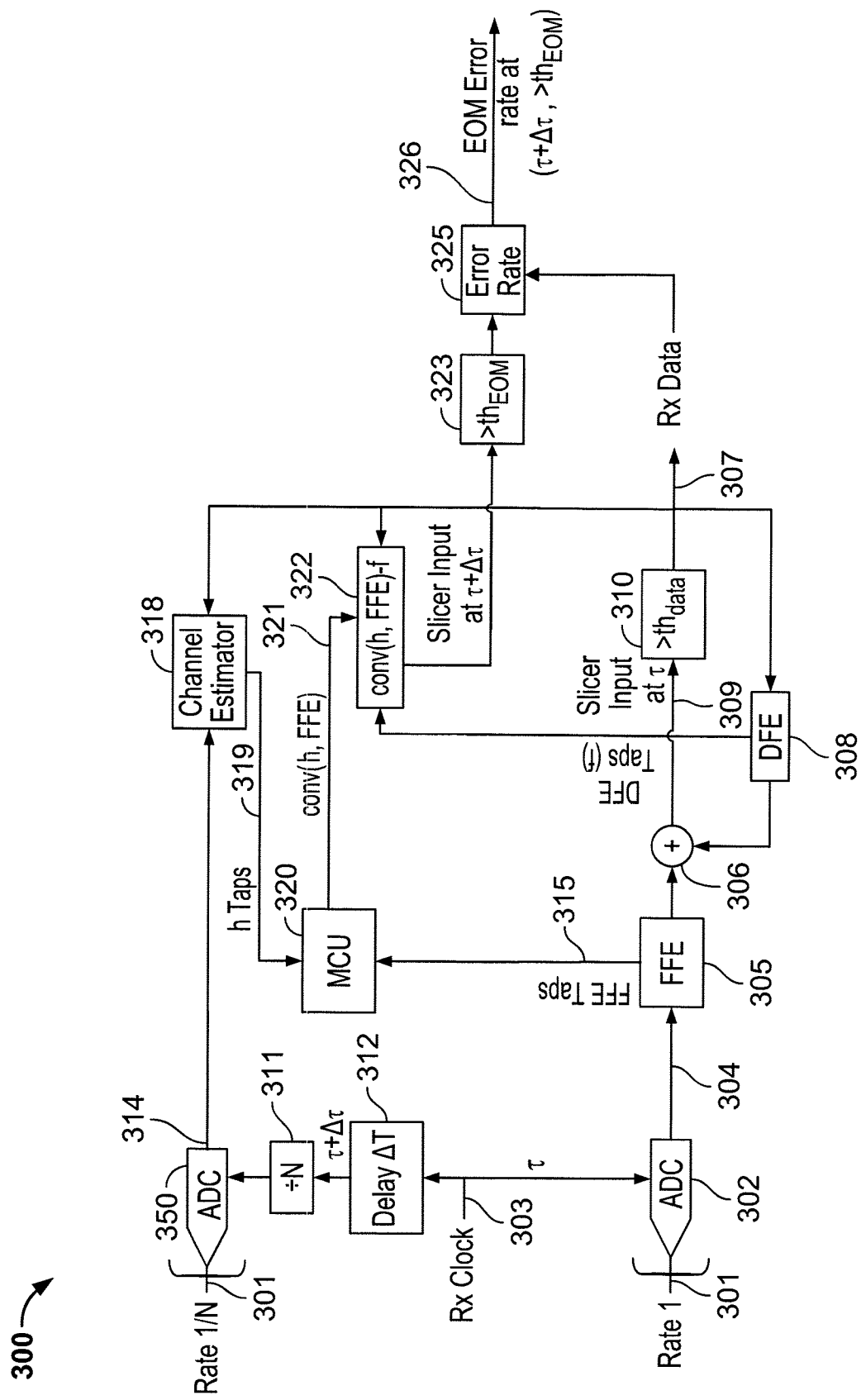
FIG. 3 is a diagram of a third implementation of an ADC-based SerDes device according to the subject matter of this disclosure.

A third implementation 300 of the subject matter of this disclosure, shown in FIG. 3, reconstructs only inter-symbol interference by estimating h from a known phase relationship between ADC 302 and sub-sampled ADC 350. For example, h may be estimated using the technique described in commonly-assigned U.S. Pat. No. 10,291,437, which is hereby incorporated by reference in its entirety. The estimated h is then convolved with coefficients of the FFE filter from the main data path to determine, along with taps of the DFE filter in the main data path, the coefficients of a filter that is used on the recovered data. The result is input to the EOM slicer.

The data path of implementation 300 operates similarly to the data path of implementation 100 and implementation 200, as follows. First, data signal 301 is sampled by ADC 302, which is clocked by receive clock signal 303. ADC 302 outputs samples $y_n^{(\tau)}$ at 304. The samples $y_n^{(\tau)}$ are filtered by feed-forward equalization (FFE) filter 305, and the filtered samples are combined at 306 with output data samples 307 which are fed back and filtered by decision-feedback equalization (DFE) filter 308. The combined filtered samples at 309 are input to thresholding or slicing circuitry 310 which generates the output data samples 307 based on a data threshold $th_{data}$. As noted above, the data path that has just been described operates in real time to provide output data 307.

The remainder of implementation 300 is provided for data eye monitoring. For the purpose of data eye monitoring, a second ADC 350 is provided. ADC 350 samples data signal 301 at a slower rate (i.e., sub-samples data signal 301), which is achieved by dividing receive clock 303 at 311 by an integer N. Because ADC 350 sub-samples data signal 301, the data eye monitoring circuitry can operate as slowly as 1/N times the speed of operation of the data path. Therefore, the data eye monitoring circuitry can be slower and consume less power and, per unit processing power, occupy less device area, than the data path circuitry.

In addition to, and before, being divided by N, receive clock 303 is delayed at 312 by Δτ relative to the sampling point of the data path. As noted above, Δτ can be varied to sweep the data eye. Thus, any given sample of sub-sampled ADC 350, in addition to occurring only once for every N samples taken by ADC 302, is offset in time from the nearest sample taken by ADC 302 by a time delay Δτ, which could be negative (i.e., the sample taken by sub-sampled ADC 350 could be advanced ahead of, rather than delayed behind, the nearest sample taken by ADC 302).

Time-offset sample $y_n^{(\tau+\Delta\tau)}$ output at 314 by sub-sampled ADC 350 is delayed by Δτ relative to sample 304. Therefore, all signals passing between the main data path and the data eye monitoring circuitry may be delayed appropriately (not shown) to align them correctly.

Output data samples 307 are input to h channel estimator 318 along with delayed time-offset sample 314. Channel estimate 319 is convolved at 320 with the taps of FFE filter 305. For example, the convolution may be performed by a microcontroller unit 320. The convolution output 321 may be used, along with the taps f of main data path DFE filter 308 as the coefficients of a further filter 322 to which the output data samples 307 are input. The outputs of filter 322, are input to thresholding or slicing circuitry 323 in the data eye monitoring path.

The output of thresholding or slicing circuitry 310 in the data path at τ is input, along with the output of thresholding or slicing circuitry 323 in the data eye monitoring path, to error-rate circuitry 325 to provide the eye-monitoring error rate 326.

Figure 4:
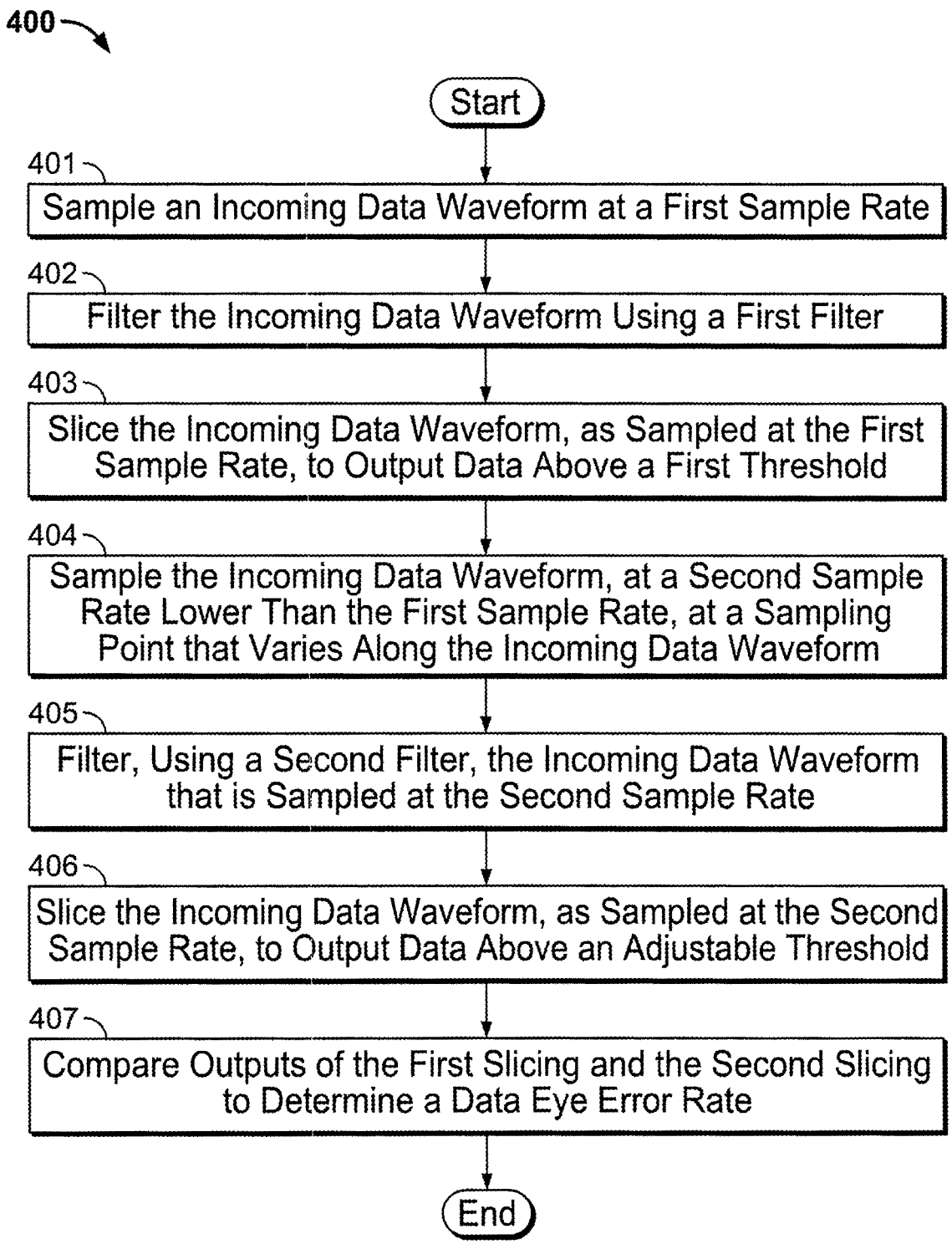
FIG. 4 is a flow diagram of a method according to an implementation of the subject matter of this disclosure.

A data eye monitoring method in accordance with implementations of the subject matter of this disclosure is shown in FIG. 4. Method 400 begins at 401, where an incoming data waveform is sampled at a first sample rate. At 402, the incoming data waveform is filtered using a first filter. At 403, the incoming data waveform, as sampled at the first sample rate, is sliced to output data above a first threshold. At 404, the incoming data waveform is sampled at a second sample rate lower than the first sample rate; the sampling point will vary at different times along the incoming data waveform to sweep the width of the eye. At 405, the incoming data waveform that is sampled at the second sample rate is filtered using a second filter. At 406, the incoming data waveform, as sampled at the second sample rate, is sliced to output data above a threshold; the threshold is adjustable to sweep the height of the eye. At 407, outputs of the first slicing operation and the second slicing operation are compared to determine a data eye error rate, and method 400 ends.

Thus it is seen that a digital SerDes system, in which non-destructive data eye monitoring is provided without duplicating the full data path, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. Digital serializer/deserializer circuitry comprising:
a data path including:
a first analog-to-digital converter configured to sample an incoming data waveform at a first sample rate,
first digital filter circuitry configured to filter output of the first analog-to-digital converter, and
a first output data slicer coupled to output of the first digital filter circuitry and configured to output data above a threshold;
a data eye monitoring path including:
a second analog-to-digital converter configured to sample the incoming data waveform at a second sample rate lower than the first sample rate, the second analog-to-digital converter further being configured to take samples at varying sampling points along the incoming data waveform,
second digital filter circuitry configured to filter output of the second analog-to-digital converter, and
a second output data slicer coupled to an output of the second digital filter circuitry, the second output data slicer being configured to output data above an adjustable threshold and to sweep through varying threshold values for different samples; and
error rate circuitry configured to compare outputs of the first output data slicer and the second output data slicer to determine a data eye error rate.

2. The digital serializer/deserializer circuitry of claim 1 wherein:
the first analog-to-digital converter is configured to sample the incoming data waveform at a first point in time;
the second analog-to-digital converter is configured to sample the incoming data waveform at a second point in time, among the varying sampling points, that is different from the first point in time;
the second digital filter circuitry includes a channel estimation filter configured to determine a change in channel response between the first point in time and the second point in time; and
the second digital filter circuitry includes an additional filter having filter characteristics of the first filter circuitry and configured to filter the change in channel response.

3. The digital serializer/deserializer circuitry of claim 2 wherein the channel estimation filter is an adaptive filter.

4. The digital serializer/deserializer circuitry of claim 3 wherein the adaptive filter is a least-mean squares filter.

5. The digital serializer/deserializer circuitry of claim 2 wherein the second digital filter circuitry further comprises:
comparator circuitry configured to compare output of the channel estimation filter to output of the second analog-to-digital converter to determine signal noise; and
circuitry configured to combine the signal noise with output of the additional filter for input to the second output data slicer.

6. The digital serializer/deserializer circuitry of claim 5 wherein the channel estimation filter is further configured to input the signal noise as an error for adaptation.

7. The digital serializer/deserializer circuitry of claim 5 wherein the circuitry configured to combine the signal noise with output of the additional filter is configured to apply a weight to the signal noise.

8. The digital serializer/deserializer circuitry of claim 2 further comprising delay circuitry for combining the output of the first digital filter circuitry with the output of the second digital filter circuitry for input to the second output data slicer.

9. The digital serializer/deserializer circuitry of claim 1 wherein:
the first analog-to-digital converter is configured to sample the incoming data waveform at a first point in time;
the second analog-to-digital converter is configured to sample the incoming data waveform at a second point in time, among the varying sampling points, that is different from the first point in time; and
the second digital filter circuitry includes:
a channel estimation filter configured to determine a change in channel response between the first point in time and the second point in time,
convolution circuitry configured to convolve the change in channel response with an output of the first digital filter circuitry to derive filter coefficients, and
an additional filter using the filter coefficients derived by the convolution circuitry.

10. The digital serializer/deserializer circuitry of claim 9 wherein the convolution circuitry comprises a microcontroller unit.

11. The digital serializer/deserializer circuitry of claim 9 further comprising delay circuitry for combining the output of the first digital filter circuitry with the output of the second digital filter circuitry for input to the second output data slicer.

12. A method of data eye monitoring in digital serializer/deserializer circuitry, the method comprising:
sampling an incoming data waveform at a first sample rate;
filtering, using a first filter, the incoming data waveform that is sampled at the first sample rate;
slicing the incoming data waveform, as sampled at the first sample rate, to output data above a first threshold;
sampling the incoming data waveform, at a second sample rate lower than the first sample rate, at a sampling point along the incoming data waveform;
filtering, using a second filter, the incoming data waveform that is sampled at the second sample rate;
slicing the incoming data waveform, as sampled at the second sample rate, to output data above an adjustable threshold; and
comparing outputs of the first slicing and the second slicing to determine a data eye error rate.

13. The method of claim 12 wherein:
the sampling an incoming data waveform at the first sample rate occurs at a first point in time;
the sampling the incoming data waveform, at the second sample rate lower than the first sample rate, is performed at at least one second point in time that is different from the first point in time, at a sampling point that varies along the incoming data waveform; and
the filtering the incoming data waveform that is sampled at the second sample rate comprises estimating to determine a change in channel response between the first point in time and the second point in time, and further filtering the change in channel response.

14. The method of claim 13 wherein the further filtering the change in channel response comprises filtering the change in channel response using a second filter having filter characteristics of the first filter.

15. The method of claim 13 further comprising:
comparing the change in channel response to the incoming data waveform sampled at a second sample rate to determine signal noise; and
combining the signal noise with the further filtered change in channel response prior to the slicing the incoming data waveform to output data above the adjustable threshold.

16. The method of claim 15 wherein the estimating to determine a change in channel response comprises inputting the signal noise as an error for adaptation.

17. The method of claim 15 wherein the combining the signal noise with the further filtered change in channel response, prior to the slicing the incoming data waveform to output data above the adjustable threshold, comprises applying a weight to the signal noise.

18. The method of claim 13 further comprising delaying the incoming data waveform that is sampled at the first sample rate, as filtered using the first filter, and combining the delayed filtered incoming data waveform with the incoming data waveform that is sampled at the second sample rate, as filtered using the second filter, prior to the slicing the incoming data waveform to output data above the adjustable threshold.

19. The method of claim 12 wherein:
the sampling an incoming data waveform at the first sample rate occurs at a first point in time;
the sampling the incoming data waveform, at the second sample rate lower than the first sample rate, is performed at at least one second point in time that is different from the first point in time, at a sampling point that varies along the incoming data waveform; and
the filtering the incoming data waveform that is sampled at the second sample rate comprises:
estimating to determine a change in channel response between the first point in time and the second point in time,
convolving the change in channel response with an output of the first digital filter circuitry to derive filter coefficients, and
filtering the incoming data waveform that is sampled at the second sample rate, using the filter coefficients derived by the convolving.

20. The method of claim 19 further comprising delaying the incoming data waveform that is sampled at the first sample rate, as filtered using the first filter, and combining the delayed filtered incoming data waveform with the incoming data waveform that is sampled at the second sample rate, as filtered using the second filter, prior to the slicing the incoming data waveform to output data above the adjustable threshold.

\* \* \* \* \*